United States Patent
Gulari

(10) Patent No.: US 7,935,613 B2
(45) Date of Patent: May 3, 2011

(54) THREE-DIMENSIONAL SILICON ON OXIDE DEVICE ISOLATION

(75) Inventor: Levent Gulari, Marlboro, NY (US)

(73) Assignee: International Business Machines Corporation, Armonk, NY (US)

( * ) Notice: Subject to any disclaimer, the term of this patent is extended or adjusted under 35 U.S.C. 154(b) by 1353 days.

(21) Appl. No.: 10/596,569

(22) PCT Filed: Dec. 16, 2003

(86) PCT No.: PCT/US03/40079
§ 371 (c)(1),
(2), (4) Date: Jun. 16, 2006

(87) PCT Pub. No.: WO2005/062364
PCT Pub. Date: Jul. 7, 2005

(65) Prior Publication Data
US 2010/0013044 A1    Jan. 21, 2010

(51) Int. Cl.
*H01L 21/30* (2006.01)
(52) U.S. Cl. .......... 438/475; 257/347
(58) Field of Classification Search .......... 438/407, 438/475, 311, 219; 257/E21.499
See application file for complete search history.

(56) References Cited

U.S. PATENT DOCUMENTS

| | | | |
|---|---|---|---|
| 5,929,507 A * | 7/1999 | Gonzalez et al. | 257/617 |
| 6,031,261 A | 2/2000 | Kang | |
| 6,309,934 B1 * | 10/2001 | Peckerar et al. | 438/299 |
| 6,548,369 B1 | 4/2003 | van Bentum | |
| 6,653,209 B1 * | 11/2003 | Yamagata | 438/459 |
| 7,153,753 B2 * | 12/2006 | Forbes | 438/404 |
| 7,368,790 B2 * | 5/2008 | Forbes | 257/396 |
| 2002/0081824 A1 * | 6/2002 | Dolan et al. | 438/480 |
| 2003/0124815 A1 * | 7/2003 | Henley et al. | 438/460 |
| 2005/0026429 A1 * | 2/2005 | Liaw | 438/689 |

FOREIGN PATENT DOCUMENTS

| | | |
|---|---|---|
| EP | 0461362 | 8/1997 |
| JP | 07-078994 A | 3/1995 |
| JP | 07-263538 A | 10/1995 |
| JP | 07-263575 A | 10/1995 |
| JP | 11-040512 A | 2/1999 |
| JP | 2002-026137 | 1/2002 |
| KR | 2001-0103602 | 11/2001 |
| WO | WO03/083934 A | 10/2003 |

(Continued)

OTHER PUBLICATIONS

Haver H B et al. "Three-Dimensional Silicon on Oxide Device Isolation" Motorola Technical Developments, Motorola Inc. Schaumburg, Illinois, US vol. 7, Oct. 1, 1987 pp. 20-21, XP000050047.

(Continued)

*Primary Examiner* — Nathan W Ha
(74) *Attorney, Agent, or Firm* — Lisa V. Jaklitsch; Joseph Petrokaitis

(57) ABSTRACT

A silicon-on-insulator wafer (10). The SOI wafer (10) comprises a top silicon layer (6), a silicon substrate (4), and an oxide insulator layer (2) disposed across the wafer (10) and between the silicon substrate (4) and the top silicon layer (6). The oxide insulator layer (2) has at least one of a contoured top surface (8a, 8b, 8c, 8d, 8e) and a contoured bottom surface (12e). Also provided are processes for manufacturing such a SOI wafer (10).

13 Claims, 5 Drawing Sheets

FOREIGN PATENT DOCUMENTS

WO 2005/062364 A1 7/2005

OTHER PUBLICATIONS

Mao B-Y et al. "The Effect of Post-Oxygen-Implant Annealing Temperature on the Channel Mobilities of CMOS Devices in Oxygen-Implanted Silicon-On-Insulator Structures" IEEE Electron Device Letters, IEEE Service Center, New York, NY US vol. EDL-8, No. 7 Jul. 7, 1987, pp. 306-308, XP000821840.

International Search Report dated May 5, 2005.

* cited by examiner

THREE-DIMENSIONAL SILICON ON OXIDE DEVICE ISOLATION

TECHNICAL FIELD

The present invention relates generally to silicon-on-insulator wafers and, more particularly, to a contoured insulator layer of such wafers.

BACKGROUND OF THE INVENTION

The process of manufacturing electric circuits involves connecting isolated devices through specific electrical paths. When manufacturing silicon integrated circuits (ICs) or chips, therefore, the devices built into the silicon must be isolated from one another. The devices can subsequently be interconnected to create the specific circuit configurations desired. Thus, isolation technology is one of the critical aspects of manufacturing ICs.

A variety of techniques have been developed to isolate devices in ICs. One reason is that different IC types have different isolation requirements. Such types include, for example, NMOS, CMOS, and bipolar. An NMOS or negative-channel metal-oxide semiconductor is a type of semiconductor that is negatively charged so that transistors are turned on or off by the movement of electrons. In contrast, a PMOS (positive-channel MOS) works by moving electron vacancies. An NMOS is faster than a PMOS, but also more expensive to produce.

A CMOS or complementary metal oxide semiconductor uses both NMOS (negative polarity) and PMOS (positive polarity) circuits. Because only one of the circuit types is on at any given time, CMOS chips require less power than chips using just one type of transistor. This makes CMOS chips particularly attractive for use in battery-powered devices, such as portable computers. Personal computers also contain a small amount of battery-powered CMOS memory to hold the date, time, and system setup parameters.

The bipolar transistor is an electronic device with two pn junctions in close proximity. There are three device regions: an emitter, a base (the middle region), and a collector. The two pn junctions (i.e., the emitter-base and collector-base junctions) are in a single bar of semiconductor material, separated by a distance. Modulation of the current flow in one pn junction by changing the bias of the nearby junction is called bipolar-transistor action. External leads can be attached to each of the three regions, and external voltages and currents can be applied to the device from these leads.

These and other different IC types require different isolation technologies. In addition, the various isolation technologies have different attributes with respect to minimum isolation spacing, surface planarity, process complexity, and density of defects generated during manufacture of the isolation structure. Tradeoffs must be made among these characteristics when selecting an appropriate isolation technology for a particular circuit application.

Historically, because bipolar ICs were the first to be developed, a technology for isolating the collector regions of the bipolar devices was also the first to be invented (called junction isolation, a term including structures that are isolated by an oxide along the side walls and by a junction at the bottom). PMOS and NMOS ICs did not need junction isolation; nevertheless, it was still necessary to provide an isolation structure that would prevent the establishment of parasitic channels between adjacent devices. The most important technique developed was called LOCOS isolation (for LOCal Oxidation of Silicon), which involved the formation of a semi-recessed oxide in the nonactive areas of the substrate.

As device geometries reached submicron size, conventional LOCOS isolation technologies reached the limits of their effectiveness. Therefore, alternative isolation processes for CMOS and bipolar technologies were needed. Modified LOCOS processes, which overcome some of the drawbacks of conventional LOCOS for small-geometry devices; trench isolation; and selective-epitaxial isolation—all were among the newer approaches adopted.

Devices that must function under high voltages and in harsh radiation environments require even more stringent isolation technologies. Junction isolation is not suitable for high-voltage applications because at supply voltages of +30 volts junction breakdown occurs under reasonable doping levels and device-structure dimensions. Transient photocurrents produced in pn junctions by gamma rays render junction isolation ineffective in high-radiation environments. For such applications, a preferred isolation technique is one that depends on completely surrounding devices with an insulator, rather than with a pn junction.

These techniques are generally termed silicon-on-insulator ("SOI") isolation processes. Included within SOI isolation processes are older approaches such as dielectric isolation ("DI") and silicon-on-sapphire ("SOS"). Also included are more recently developed technologies: separation by implanted oxygen ("SIMOX"), zone-melting-recrystallization ("ZMR"), full isolation by porous-oxidized silicon ("FIPOS"), and wafer bonding. The SOI process was developed by International Business Machines Corporation.

Unlike CMOS-based chips that are doped with impurities enabling the chip to store capacitance that must be discharged and recharged, SOI chips are formed by setting transistors on a thin silicon layer that is separated from the silicon substrate by an insulator layer of thin silicon oxide or glass, which minimizes capacitance (or the energy absorbed from the transistor). Full isolation is provided.

SOI isolation offers many advantages. In some cases, the SOI technique uses simpler manufacturing sequences and yields an improved cross-section compared to circuits fabricated on bulk silicon. These advantages are illustrated in FIGS. 1A and 1B, which compare a mesa-isolated SOI CMOS process (FIG. 1B) with a p-well bulk CMOS process (FIG. 1A). SOI isolation also provides reduced capacitive coupling between various circuit elements over the entire IC and, in CMOS circuits, latch up is eliminated. SOI isolation may reduce chip size, increase packing density, or both. Minimum device separation is determined only by the limitation of lithography. Finally, reductions in parasitic capacitance and chip size allow the SOI process to provide increased circuit speed.

When an SOI technology based on a thin silicon film is used, two other important advantages can be obtained. First, a relatively benign surface topography (for step coverage) is produced if device isolation can be achieved by a complete island, sloped-etch wall process of the thin silicon film. Second, because SOI isolation techniques eliminate the parasitic field of the field effect transistor ("FET") between adjacent devices, LOCOS processes are not needed.

As with all isolation technologies, SOI isolation has its disadvantages. For example, active-device regions in SOI technologies tend to be poorer in crystalline quality than their counterparts in bulk silicon. More relevant to the present invention, the presence of an insulator layer tends to complicate or prevent the adoption of effective defect-gettering and impurity-gettering processes. Nevertheless, the advantages of SOI isolation are sufficiently attractive that improvements to the technique have important commercial implications.

To overcome the shortcomings of conventional SOI isolation processes and the devices resulting from such processes, a new process of manufacturing a SOI wafer and the wafer itself are provided. An object of the present invention is to increase the reliability, ease, and efficiency of the process of manufacturing SOI wafers. A related object is to widen the lithographic focus window of the manufacturing process. Another object is to reduce the time required to market SOI wafers. It is still another object of the present invention to positively impact photoresist thickness and stepper manufacturer selection during manufacture.

An additional object of the present invention is to incorporate improved SOI wafers into such applications as optical switches. A related object is to increase the speed of optical switches. Yet another object of this invention is to reduce power consumption.

SUMMARY OF THE INVENTION

To achieve these and other objects, and in view of its purposes, the present invention provides a silicon-on-insulator wafer comprising a top silicon layer, a silicon substrate, and an oxide insulator layer disposed across the wafer and between the silicon substrate and the top silicon layer. The oxide insulator layer has at least one of a contoured top surface and a contoured bottom surface. Also provided are processes for manufacturing such a silicon-on-insulator wafer.

One process for manufacturing a silicon-on-insulator wafer according to the present invention comprises the initial step of providing a silicon substrate. An oxide insulator layer is formed across the wafer, the insulator layer being buried within the silicon substrate, dividing the silicon substrate from a top silicon layer, and having a top surface and a bottom surface. Next, the insulator layer is thickened. At least one of a contoured top surface and a contoured bottom surface of the insulator layer is created. Finally, the structure is annealed to further thicken and contour the insulator layer.

Another exemplary process for manufacturing a silicon-on-insulator wafer according to the present invention also comprises the initial step of providing a silicon substrate. Again, an oxide insulator layer is formed across the wafer, the insulator layer being buried within the silicon substrate, dividing the silicon substrate from a top silicon layer, and having a top surface and a bottom surface. Next, the insulator layer is thickened. The chip periodicity for the wafer is generated and the coordinates are set where a predetermined topography of the buried oxide insulator layer is desired. The coordinates are transferred to an oxygen implanter for implementation. The energy, dose, or temperature of the oxygen implant are adjusted with the implanter scanning and the wafer tilting or rotating according to preset coordinates from the chip periodicity map at the predetermined thicknesses and contours required. Created is at least one of a contoured top surface and a contoured bottom surface of the insulator layer. Finally, the structure is annealed to further thicken and contour the insulator layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
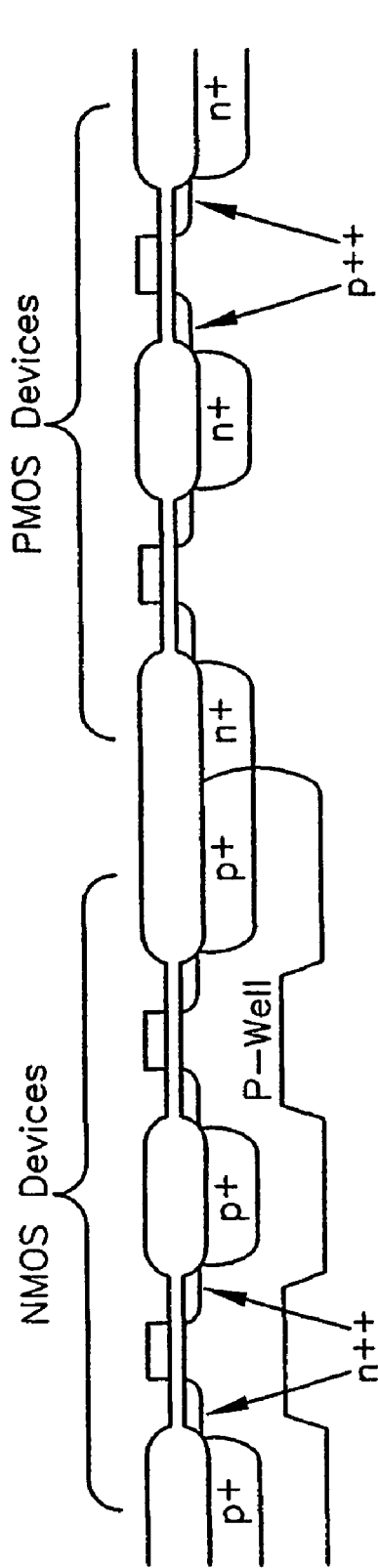
FIG. 1A illustrates a conventional p-well bulk CMOS process.
Figure 1B:
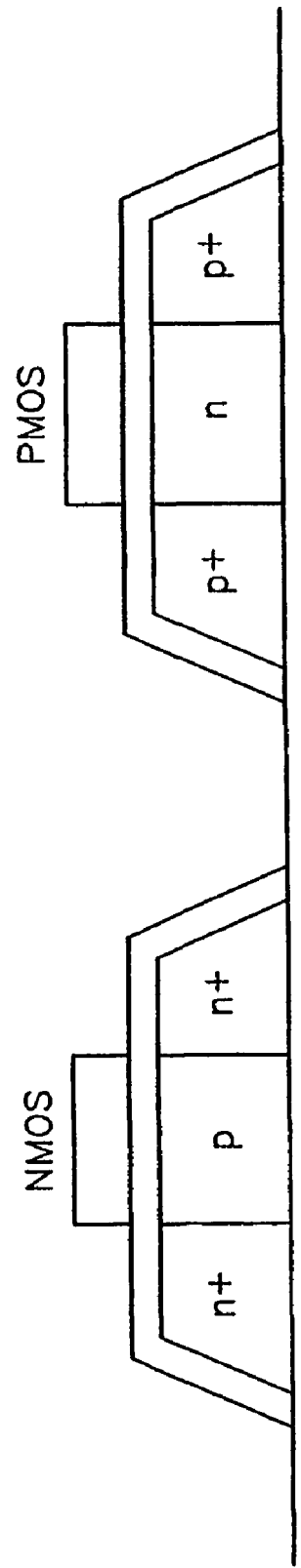
FIG. 1B illustrates a conventional mesa-isolated silicon-on-insulator CMOS process.
Figure 2:
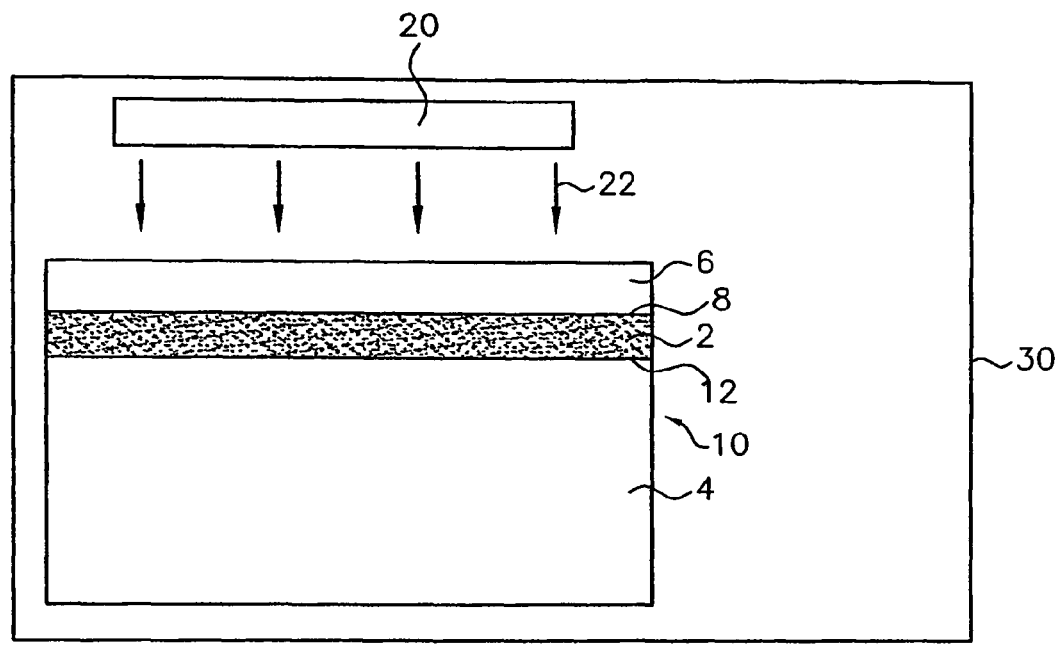
FIG. 2 illustrates a conventional apparatus for the formation of a SIMOX wafer.

Referring now to the drawing, in which like reference numbers refer to like elements throughout the various figures that comprise the drawing, FIG. 2 shows a conventional apparatus for the formation of a SIMOX wafer 10. The creation of a buried insulator layer 2 of silicon dioxide ($SiO_2$) by implanting oxygen into a silicon substrate 4 through the SIMOX process is one of the main commercial techniques for creating SOI structures. A top silicon layer 6 resides on the insulator layer 2.

The technique requires a high dose (~$2 \times 10^{18}$ $cm^{-2}$) of oxygen ($O^+$) ions 22 from an implantation source 20; this dose provides the minimum concentration necessary to ensure that a continuous layer of stoichiometric silicon dioxide will be formed by reaction of the oxygen with silicon during the annealing process. The energy of the implant must also be high enough (150-180 keV) that the peak of the implant is sufficiently deep within the silicon (0.3-0.5 μm). The wafer is normally heated to more than 400° C. during the implantation process to ensure that the surface maintains its crystallinity during the high-dose implantation step.

A post-implant anneal is performed in a neutral ambient 30 such as $N_2$ or in $O_2$ to a sufficient time (3-5 hours) and at a high enough temperature (1,100-1,500° C.) to form a buried layer of silicon dioxide. The anneal step also allows excess oxygen in the surface silicon to out-diffuse, thereby increasing the dielectric strength of the burled oxide ("BOX") layer. After the anneal step, the crystalline-silicon surface is typically thin (about 100-300 nm). Therefore, an additional layer of epitaxial silicon is usually deposited so that single-crystal device regions $\geqq 0.5$ μm thick are available for fabricating devices.

The Table provided below summarizes data obtained using a scanning electron microscope ("SEM") to measure cross-sections on sample SOI wafers 10 manufactured using the SIMOX process. The data include thicknesses of buried insulator layers 2 and silicon-on-insulator layers 6 obtained with five different oxygen implant sequences while holding the anneal constant (at 1,450° C.). The examples are included to more clearly demonstrate the overall nature of the invention. These examples are exemplary, not restrictive, of the invention.

| Dose | Energy | Twist | Temp. | Avg BOX | SOI | Total Oxide Depth Bottom of BOX |
|---|---|---|---|---|---|---|
| 1st | | | | | | |
| 1.25E+017 | 178K | 20 Deg. | 365 C. | | | |
| 2nd | | | | | | |
| 1.45E+017 | 178K | 200 Deg. | 365 C. | | | |
| 1.25E+017 | 178K | 200 Deg. | 365 C. | | | |
| 1.05E+017 | 178K | 200 Deg. | 365 C. | | | |
| 3rd | | | | | | |
| 2.00E+015 | 165K | 20 Deg. | Room | 1382 | 678 | 2060 |
| 1.00E+015 | 163K | 20 Deg. | Room | 1312 | 663 | 1975 |
| 2.00E+015 | 161K | 20 Deg. | Room | 1234 | 616 | 1850 |
| 1450 C. | Anneal | | | | | |
| 1st | | | | | | |
| 1.25E+017 | 169K | 20 Deg. | 365 C. | | | |
| 2nd | | | | | | |
| 1.25E+017 | 169K | 200 Deg. | 365 C. | | | |
| 1.05E+017 | 169K | 200 Deg. | 365 C. | | | |
| 3rd | | | | | | |
| 2.00E+015 | 157K | 20 Deg. | Room | 1339 | 484 | 1823 |
| 1.5E+015 | 157K | 20 Deg. | Room | 1210 | 429 | 1639 |
| 1450 C. | Anneal | | | | | |

In summary, a SOI wafer 10 is a structure in which a buried insulator layer 2 electrically isolates a silicon layer 6 from a silicon substrate 4. The buried insulator layer 2 does not always occupy the entire silicon substrate 4. Often, the insulator layer 2 occupies a portion of the silicon substrate 4. Regardless, the conventional SOI wafer 10 includes an insulator layer 2 having a substantially flat top surface 8 and a substantially flat bottom surface 12. The thickness uniformity specification for a flat insulator layer 2 is usually ±1%, although the degree of flatness can vary randomly across the wafer surface.

SIMOX has some advantages over other SOI technologies. Perhaps the most important advantage is that the technology is transparent to the manufacturing line; the fabrication of SIMOX-based circuits uses processing steps similar to those used in conventional IC manufacturing. The SIMOX process does have some drawbacks, however, and the present invention is not limited to that specific process. For example, the SIMOX process requires the availability of a special oxygen implanter. High-beam-current implanter machines are necessary to make high-volume production of wafers more feasible. Implantation parameters and anneal schedules must be chosen appropriately to provide optimum IC performance because the microstructure of the surface-silicon film is sensitive to the oxygen dose and the post-oxygen implant annealing temperature. For example, a lower dose of oxygen results in a higher oxygen content in the silicon film and a higher density of oxygen precipitates at the silicon-film/buried oxide interface following an anneal at 1,150° C. For oxygen doses of $2.25 \times 10^{18}$ cm$^{-2}$, thermal annealing at 1,275° C. annihilates the oxygen precipitates in the silicon film.

It has been discovered that, all other conditions being equal, the same chips built on and across an SOI wafer do not display the same electrical and physical characteristics expected from them. Rather, the chips suffer performance loss due to leakage from the top silicon layer 6 to the silicon substrate 4 through the insulator layer 2. It has further been discovered that some performance losses can be avoided if the buried insulator layer 2 is purposefully not made flat. Thus, according to the present invention, the topography of the buried insulator layer 2 is patterned or altered to achieve a variety of advantages relative to the conventional, substantially flat buried oxide layer. Several specific embodiments of the topography are presented below for purposes of illustration. The embodiments may be combined across a wafer. The controlled and patterned topography can be applied to one or both sides (i.e., the top and bottom) of the insulator layer 2.

1. CONVEX CONTOUR

The lithographic process window is most affected by wafer topography which displays a significant center-to-edge delta. The lithographic process is also affected by the top-center photoresist location during coating which usually leaves the resist somewhat thinner in the center region of the wafer. The thinner center region causes features to shrink, flop over for the gate, or leave imperfect resist side wall profiles—risking implant and therefore device inaccuracies.

In addition, various oxide charging and internal arcing mechanisms caused by processing may eventually thin the insulator layer 2—especially at the center of the wafer 10. The insulator layer 2 usually does not retain its uniform flatness during extensive semiconductor processing; rather, the insulator layer 2 becomes thinner and thinner in the center region of the wafer 10 compared to the edge throughout processing while not being directly exposed a large majority (99%) of the time. Such thinning causes a degradation in performance.

Figure 3:
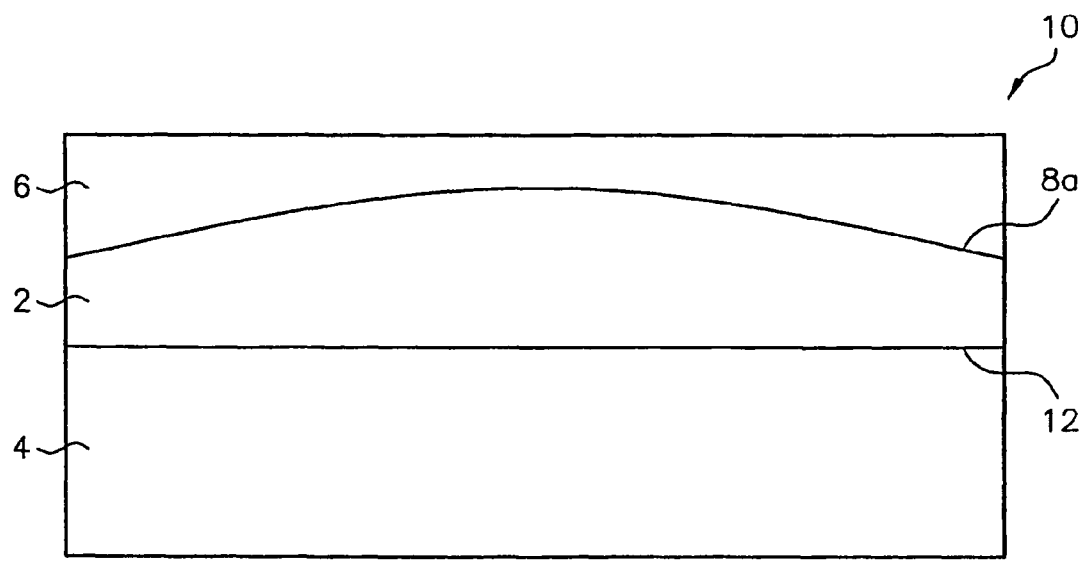
FIG. 3 illustrates an insulator layer of a SOI wafer according to the present invention with a convex top surface.

In a first embodiment of the present invention, the top 8a of the buried insulator layer 2 is given a contoured convex shape as illustrated in FIG. 3. The insulator layer 2 may be made of any minimum thickness at the edge and maximum thickness at the center region of any SOI wafer 10 of any diameter. One important advantage of the convex shape is that it anticipates and compensates for the implicit central thinning of the insulator layer 2. Even a relatively mild tapering across the wafer can go a long way in anticipating the seemingly inevitable thinning.

An exemplary process to obtain the uniformly contoured convex shape of the top 8a of the insulator layer 2 of the SOI wafer 10 uses existing technology: a single crystal silicon wafer of any dimension and thickness, a qualified oxygen implanter, and a qualified oxygen anneal furnace. The first step of the process forms the deepest burled oxide insulator layer 2 uniformly across the whole wafer 10. Next, one or more of the implant dose, energy, and temperature is or are reduced to thicken this layer across the whole wafer. Then one or more of the implant dose, energy, and temperature is or are reduced to thicken this layer across a preset diameter that is less than the wafer diameter itself. It is this step of the process that initially creates the contoured convex shape of the top 8a. Finally, the wafer is annealed in an oxygen ambient to further thicken and contour the buried insulator layer 2 into a convex shape.

Figure 4:
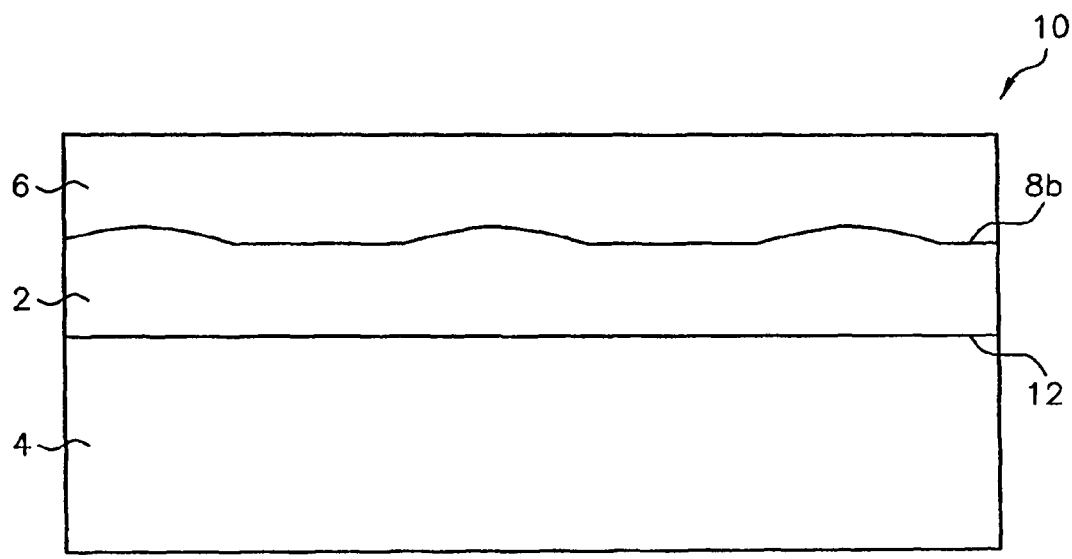
FIG. 4 illustrates an insulator layer according to the present invention with a top surface having alternating convex regions and substantially flat regions.

This process yields a uniform insulator layer 2 formed within a single crystal silicon wafer 10 by oxygen implanting. The thickness of the burled insulator layer 2 can be increased by adjusting the energy, dose, or temperature of the oxygen implant. The annealing step also contributes to the final shape of the insulator layer 2. As illustrated in FIG. 4, the process can be tailored to achieve a contoured pattern for the top 8b of the insulator layer 2 having alternating convex regions and substantially flat regions.

2. CONCAVE CONTOUR

Figure 5:
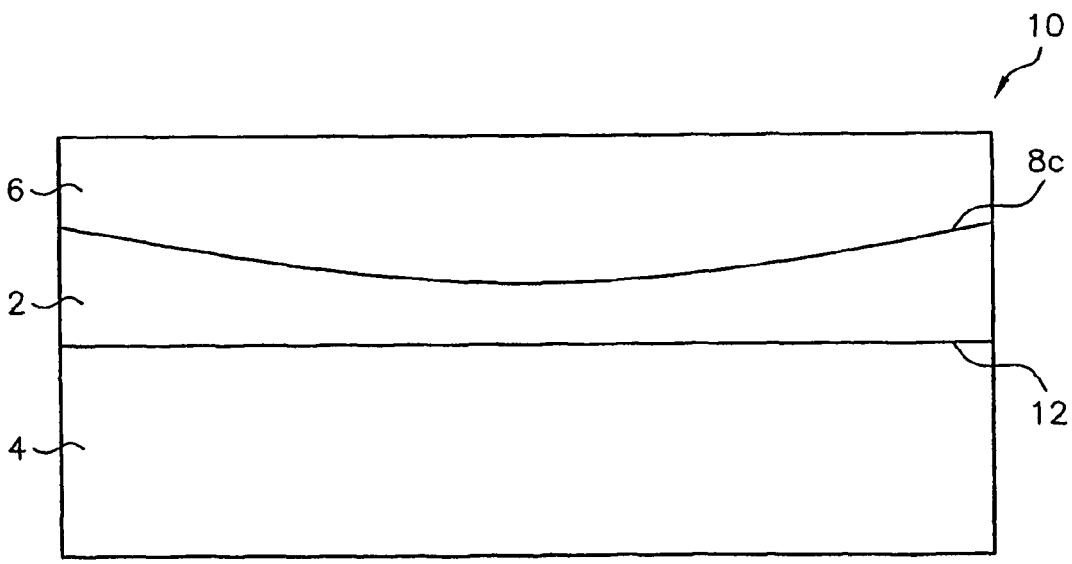
FIG. 5 illustrates an insulator layer of a SOI wafer according to the present invention with a concave top surface.

The charge trapped and built up both within and at the silicon interfaces of the buried insulator layer 2 within the silicon-on-insulator wafer 10 during various manufacturing steps eventually causes voltage breakdowns. The severity of such breakdowns depends on the thickness of the insulator layer 2 itself. In order to address the problem of voltage breakdowns, a buried insulator layer 2 having a uniformly contoured concave top 8c is provided. Such a structure is illustrated in FIG. 5. The top 8c may have any maximum thickness at the edge of the SOI wafer 10 of any diameter. The contoured concave top 8c helps to funnel the unwanted charge towards the edges of the wafer 10 where not as many chips are printed as on the rest of the wafer 10.

An exemplary process to obtain the uniformly contoured concave shape of the top 8c of the insulator layer 2 of the SOI wafer 10 uses existing technology: a single crystal silicon wafer of any dimension and thickness, a qualified oxygen implanter, and a qualified oxygen anneal furnace. The first step of the process forms the deepest buried oxide insulator layer 2 uniformly across the whole wafer 10. Next, one or more of the implant dose, energy, and temperature is or are reduced to thicken this layer across the whole wafer. Then one or more of the implant dose, energy, and temperature is or are reduced to thicken this layer around the wafer 10 in a donut area the outer diameter of which cannot exceed the diameter of the wafer 10 and the interior diameter of which must be greater than zero. The implanter may be adjusted to scan only the donut region around the wafer 10 within preset diameters. It is this step of the process that initially creates the contoured concave shape of the top 8c. Finally, the wafer is annealed in an oxygen ambient to further thicken and contour the buried insulator layer 2 into a concave shape.

Figure 6:
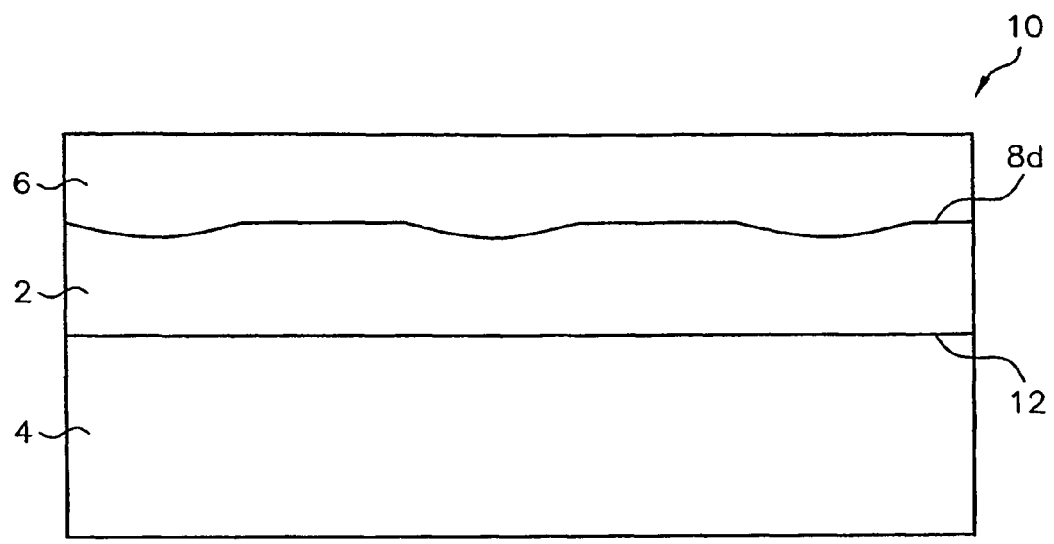
FIG. 6 illustrates an insulator layer according to the present invention with a top surface having alternating concave regions and substantially flat regions.

This process yields a uniform insulator layer 2 formed within a single crystal silicon wafer 10 by oxygen implanting. The thickness of the buried insulator layer 2 can be increased by adjusting the energy, dose, or temperature of the oxygen implant. The annealing step also contributes to the final shape of the insulator layer 2. As illustrated in FIG. 6, the process can be tailored to achieve a contoured pattern for the top 8d of the insulator layer 2 having alternating concave regions and substantially flat regions.

3. PATTERNED AND BLENDED CONTOUR

Figure 7:
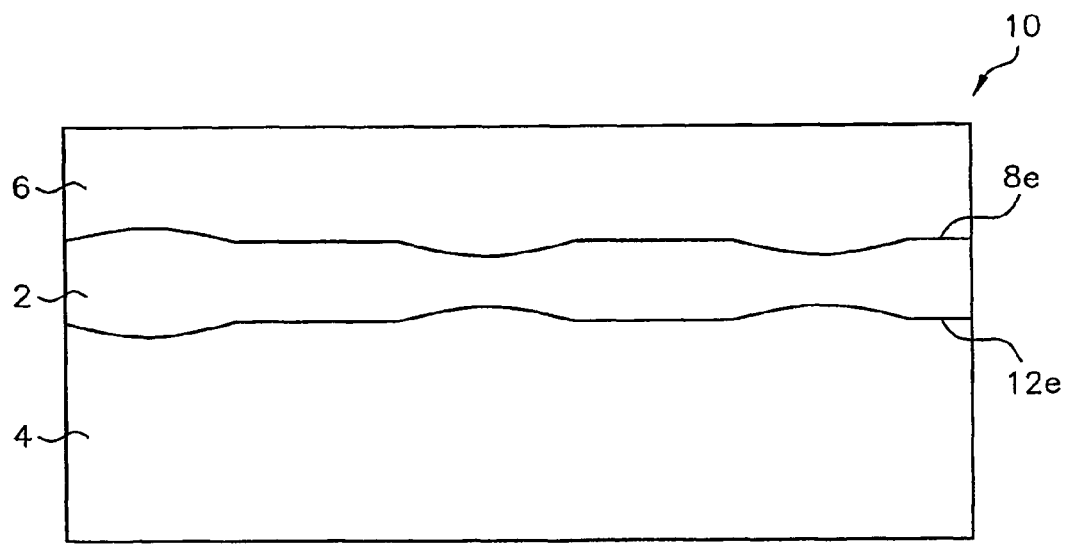
FIG. 7 illustrates an insulator layer according to the present invention with a patterned topography (both top and bottom surfaces) of controlled thickness and blended profile variations.

In order to address the various problems discussed above, a buried insulator layer 2 having a patterned topography of controlled thickness and blended profile variations is provided. Such a structure is illustrated in FIG. 7. The top 8e of the insulator layer 2 may have any combination of convex, concave, and substantially flat portions. Similarly, the bottom 12e of the insulator layer 2 may have any combination of convex, concave, and substantially flat portions. The top 8e and bottom 12e of the insulator layer 2 define between them a varying thickness for the insulator layer 2. The particular location and length of a specific contoured portion of the top 8e and bottom 12e are selected to achieve desired performance parameters for the wafer 10.

Figure 8:
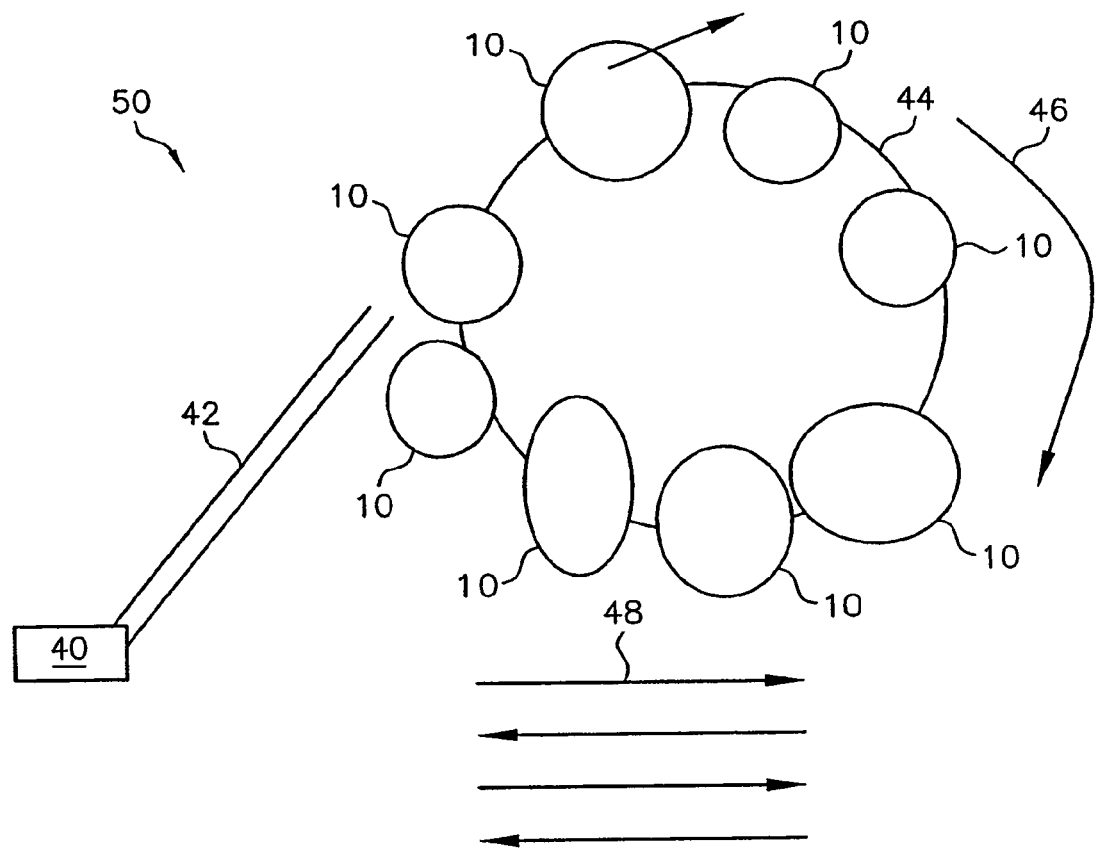
FIG. 8 illustrates an oxygen implanter constructed and configured to tilt, rotate, and both tilt and rotate the wafer to achieve the desired topography of the insulator layer according to the present invention.
Figure 9:
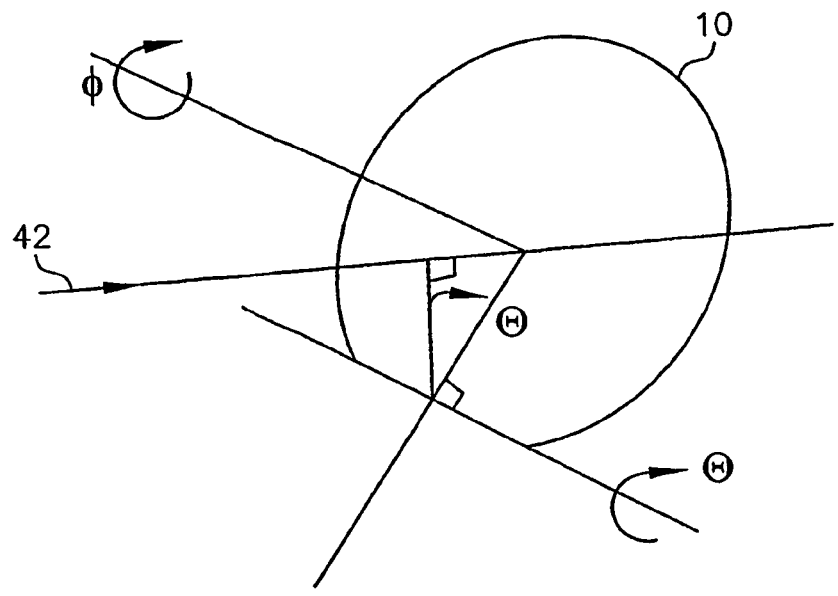
FIG. 9 further illustrates the tilt angle and the rotation angle of a wafer according to the present invention.

An exemplary process to obtain the patterned topography of controlled thickness and blended profile variations for the insulator layer 2 of the SOI wafer 10 uses specifically designed manufacturing equipment. Such equipment is illustrated in FIGS. 8 and 9. As shown in FIG. 8, an oxygen implanter 50 is constructed and configured to tilt, rotate, or both tilt and rotate the wafer 10. Such an implanter 50 allows the manufacturer to specify the angle at which the ion implant beam 42 from the ion source 40 impinges on the wafers 10 positioned on an implanter wheel 44.

The wafers 10 are notch oriented (twist) on the implanter wheel 44. The implanter wheel 44 rotates in the direction of arrow 46, namely clockwise, at a specified speed (e.g., 200 rpm). The scan directions for the ion implant beam 42 are depicted by the direction arrows 48 in FIG. 8. Thus, provided according to the present invention is a high-energy, high-current oxygen implanter 50 able to tilt and rotate wafers 10 with the maneuverability to execute such tilting and rotating actions at pre-programmed intervals during scanning. The oxygen implanter 50 can also be qualified, of course, to generate a flat buried oxide insulator layer 2 within a single crystal silicon wafer 10 like conventional or "regular" implanters.

FIG. 9 further illustrates the tilt angle $\theta$ and the rotation angle $\phi$ of a wafer 10 according to the present invention. The tilt angle $\theta$ is measured relative to the <100> direction perpendicular to the surface of a (100) silicon wafer 10. The angle results from tilting the wafer 10 about an axis located at and parallel to the <110> wafer flat. The rotation angle $\phi$ measures the rotation of the wafer 10 about an axis perpendicular to the center of the wafer 10. These two angles together specify the angle at which the ion implant beam 42 impinges on the wafer 10.

The first step of the manufacturing process forms an initial burled oxide insulator layer 2 on the wafer 10. Next, one or more of the implant dose, energy, and temperature is or are reduced to thicken this layer across the whole wafer 10. Then one or more of the implant dose, energy, and temperature is or are reduced to selectively pattern the burled insulator layer 2 with topography at predetermined coordinates. It is this step of the process that initially creates the patterned topography of controlled thickness and blended profile variations of the top 8e and bottom 12e. Finally, the wafer is annealed in an oxygen ambient to further define the shape of the buried insulator layer 2.

The process may advantageously include the step of generating the chip periodicity for the wafer and setting the coordinates where a predetermined topography of the buried oxide insulator layer 2 is desired. This information can then be transferred to the implanter 50 for implementation. The step of initiating the creation of the topography of the buried oxide insulator layer 2 by adjusting the energy, dose, or temperature of the oxygen implant can be done with the implanter scanning and the wafer 10 tilting or rotating according to preset coordinates from the chip periodicity map at the predetermined thicknesses and contours required by the structures to be built.

The oxygen implant doses, energies, and temperatures are adjusted to eliminate any silicon islands that may be lingering within the burled oxide insulator layer 2 that is being created. Furnace anneal temperatures and the percentage of oxygen in the anneal ambient determine the rate of oxygen diffusion from the ambient into the wafer 10. These parameters also determine the final thickness and the smoothness of the oxide-silicon interface.

This process yields an insulator layer 2 formed within a single crystal silicon wafer 10 by oxygen implanting. The thickness of the buried insulator layer 2 can be increased by adjusting the energy, dose, or temperature of the oxygen implant. The annealing step also contributes to the final shape of the insulator layer 2.

4. INDUSTRIAL APPLICABILITY

Especially as the technology matures, the process of selectively generating predetermined topographies on the insulator layer of an SOI wafer either across the whole wafer or in a repeating pattern based on a chip periodicity map of the wafer may be very useful in a number of applications. The present invention will be able to support both traditional and newer applications in semiconductor processing. Specifically, the invention may offer advantages for CMOS, bio chips, and other semiconductor devices. Even more specifically, the present invention may permit further reduction of the gate length.

In addition, it is desired to widen the normally narrow lithographic process window for critical dimensions across the SOI wafer. Known approaches directed toward that goal include multiple re-compensating of photomasks, photoresist system switches, and possibly the use of elaborate and involved secondary silicon growth schemes. Each approach has its own drawbacks. For a given mask set, the lithographic and other physical and electrical process windows can be widened by control and optimization of the buried insulator layer on SOI wafers according to the present invention. The invention can be adapted for all types, thicknesses, diameters, and other specifications of SOI wafers.

The thickness of the top silicon layer of the SOI structure is dictated by the target electrical performance. The thickness of the insulator layer under the top silicon layer, although not arbitrary, is not as critical as that of the top silicon layer. The reflective properties of the insulator layer can be used to optimize the numerical aperture and sigma of the lens of the lithography tool to keep the focus window as wide as possible. Current manufacturing processes simply target a uniform thickness across the SOI wafer.

The invention is also useful for optical switching especially in micro-electro-mechanical ("MEMS") systems. The curved shape of the insulator layer allows the switch to gather more light; therefore, the switch becomes faster. MEMS manufacturing is changing from bulk silicon wafers to SOI wafers due to the beneficial dielectric isolation provided by the buried oxide insulator layer within the SOI wafer. The insulator layer is also used as an etch stop for both wet and dry etching of silicon from either side of the wafer to form and define the shapes of micro structures with flat surfaces that could also selectively benefit from curved surfaces in applications like the formation of mirrors in MEMS optical switches.

Thus, one particular example where a need for the present invention currently exists involves the mirrors generated in MEMS optical switches. When these arrays are formed on single crystal SOI wafers as part of a fiber optic switch, each mirror has a diameter or edges of 50 µm or more, and the array can be 1,000×1,000. With the demand for optical bandwidth deemed to be doubling every nine months according to a 2001 survey, the need to keep the free light beams intact without any loss of signal is challenging; expensive amplification methods are usually needed after the switch. Currently, the mirrors formed on SOI wafers are substantially flat on top, which is what is typically desired, and substantially flat on the bottom because they have been defined on a flat BOX insulator layer.

This flatness helps with accuracy in terms of direction but cannot prevent the light beam from widening and becoming less defined. A local contoured topography of the buried oxide isolation layer underneath the area and volume of the SOI designated to be etched into a mirror simultaneously contours that area of the single crystal silicon itself. This topography allows a mirror to assume a concave surface to re-focus the weakened light beam at periodic intervals. Alternatively, the topography allows the mirror and the optical designers to send the light beam in two different directions by assuming a convex surface, allowing the formation of arrays in asymmetrical configurations. Variations in the BOX insulator layer thickness can also help create beams of various lengths.

What is claimed:

1. A process for manufacturing a silicon-on-insulator wafer comprising the steps of:
   providing a silicon substrate;
   forming an oxide insulator layer across the wafer by oxygen implantation, the insulator layer being buried within the silicon substrate, dividing the silicon substrate from a top silicon layer, and having a top surface and a bottom surface;
   thickening the insulator layer by reducing one or more of the implantation dose, energy, and temperature;
   creating at least one of a contoured top surface and a contoured bottom surface of the insulator layer by adjusting one or more of the implantation dose, energy, and temperature; and
   annealing to further thicken and contour the insulator layer.

2. The process of claim 1 wherein the step of forming an oxide insulator layer across the wafer by oxygen implantation is accomplished using a qualified oxygen implanter.

3. The process of claim 1 wherein the step of annealing is an oxygen anneal.

4. The process of claim 1 wherein the at least one contoured surface is uniformly convex.

5. The process of claim 4 wherein the step of forming an oxide insulator layer across the wafer by oxygen implantation is accomplished using a qualified oxygen implanter and the step of creating the at least one uniformly convex surface includes reducing one or more of the implant dose, energy, and temperature to thicken the insulator layer across a preset diameter that is less than the diameter of the wafer.

6. The process of claim 1 wherein the at least one contoured surface has alternating convex and substantially flat regions.

7. The process of claim 1 wherein the at least one contoured surface is uniformly concave.

8. The process of claim 7 wherein the step of forming an oxide insulator layer across the wafer by oxygen implantation is accomplished using a qualified oxygen implanter and the step of creating the at least one uniformly concave surface includes reducing one or more of the implant dose, energy, and temperature to thicken the insulator layer around the wafer in a donut area having an outer diameter not exceeding the diameter of the wafer an interior diameter greater than zero.

9. The process of claim 8 further comprising adjusting the implanter to scan only the donut region around the wafer within preset diameters.

10. The process of claim 1 wherein the at least one contoured surface has alternating concave and substantially flat regions.

11. The process of claim 1 wherein the at least one contoured surface includes a combination of convex, concave, and substantially flat portions.

12. The process of claim 11 wherein the step of forming an oxide insulator layer across the wafer by oxygen implantation is accomplished using a qualified oxygen implanter and the step of creating the at least one contoured surface includes reducing one or more of the implant dose, energy, and temperature to selectively pattern the buried insulator layer with topography at predetermined coordinates.

13. A process for manufacturing a silicon-on-insulator wafer comprising the steps of:

providing a silicon substrate;

forming an oxide insulator layer across the wafer by oxygen implantation, the insulator layer being buried within the silicon substrate, dividing the silicon substrate from a top silicon layer, and having a top surface and a bottom surface;

thickening the insulator layer by reducing one or more of the implantation dose, energy, and temperature;

generating the chip periodicity for the wafer and setting the coordinates where a predetermined topography of the buried oxide insulator layer is desired;

transferring the coordinates to an oxygen implanter for implementation;

adjusting the energy, dose, or temperature of the oxygen implant with the implanter scanning and the wafer tilting or rotating according to preset coordinates from the chip periodicity map at the predetermined thicknesses and contours required, thereby creating at least one of a contoured top surface and a contoured bottom surface of the insulator layer; and annealing to further thicken and contour the insulator layer.

* * * * *